United States Patent
Atkins et al.

(10) Patent No.: US 7,489,440 B2
(45) Date of Patent: Feb. 10, 2009

(54) OPTICAL SPECTRAL FILTERING AND DISPERSION COMPENSATION USING SEMICONDUCTOR OPTICAL AMPLIFIERS

(75) Inventors: Robert G. Atkins, Poughkeepsie, NY (US); Harry H. Bagheri, Poughkeepsie, NY (US); Casimer M. DeCusatis, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 11/550,935

(22) Filed: Oct. 19, 2006

(65) Prior Publication Data
US 2008/0094693 A1 Apr. 24, 2008

(51) Int. Cl.
*H01S 5/00* (2006.01)
*H01S 3/00* (2006.01)
*H04B 10/12* (2006.01)
(52) U.S. Cl. .................. 359/344; 398/58; 398/192; 398/195; 398/200; 359/337.2
(58) Field of Classification Search .............. 359/337.2, 359/344; 398/58, 192, 195, 200
See application file for complete search history.

(56) References Cited

U.S. PATENT DOCUMENTS

| | | | |
|---|---|---|---|
| 5,019,787 A * | 5/1991 | Carlson et al. ............... | 398/180 |
| 5,535,296 A * | 7/1996 | Uchida ........................ | 385/89 |
| 5,537,503 A * | 7/1996 | Tojo et al. ..................... | 385/93 |
| 5,991,484 A * | 11/1999 | Harpin et al. ................. | 385/49 |
| 6,238,100 B1 * | 5/2001 | Sasaki et al. .................. | 385/59 |
| 6,538,808 B1 | 3/2003 | Tastavridis | |
| 6,584,126 B2 | 6/2003 | Wang et al. | |
| 6,674,784 B2 | 1/2004 | Takiguchi et al. | |

(Continued)

FOREIGN PATENT DOCUMENTS

EP 0444607 A2 9/1991

(Continued)

OTHER PUBLICATIONS

International Search Report for FIS920060165PCT.

(Continued)

*Primary Examiner*—Eric Bolda
(74) *Attorney, Agent, or Firm*—Gibb & Rahman, LLC; Ira D. Blecker, Esq.

(57) ABSTRACT

The invention provides a device and a method for extending the bandwidth of short wavelength and long wavelength fiber optic lengths. The invention provides for an optical transmitter package device comprising: a laser diode; and a semiconductor optical amplifier connected directly after and in close proximity to the laser diode, wherein the semiconductor optical amplifier is adapted to operate in a frequency domain such that the semiconductor optical amplifier filters and reshapes optical wavelengths from the laser diode, and wherein the semiconductor optical amplifier is biased below an amplification threshold for the semiconductor optical amplifier. The device may also comprises a feedback circuit which comprises an optical splitter, wherein the feedback circuit samples reshaped optical output from the semiconductor optical amplifier and dynamically adjusts one or both of the semiconductor optical amplifier and the laser diode. In the case of a multimode fiber, the present invention provides the additional ability to provide a controlled offset launch into the fiber and the ability to control modal noise devoid of a specialized optical connector.

5 Claims, 3 Drawing Sheets

U.S. PATENT DOCUMENTS

| | | |
|---|---|---|
| 6,747,794 B2 | 6/2004 | Wang |
| 6,795,622 B2 * | 9/2004 | Forrest et al. ............... 385/50 |
| 6,798,568 B1 * | 9/2004 | Wang et al. ............... 359/344 |
| 6,839,481 B2 | 1/2005 | White |
| 6,894,833 B2 | 5/2005 | Goldstein et al. |
| 2002/0114067 A1 * | 8/2002 | Walker et al. ............... 359/344 |
| 2002/0176476 A1 | 11/2002 | Vakhshoori et al. |
| 2004/0012845 A1 | 1/2004 | Wang |
| 2004/0042069 A1 * | 3/2004 | Fisher ............... 359/344 |
| 2004/0136414 A1 | 7/2004 | Matsumoto et al. |
| 2005/0201669 A1 | 9/2005 | Welch et al. |

FOREIGN PATENT DOCUMENTS

JP    11202161 A  *  7/1999

OTHER PUBLICATIONS

Koga, et al., "Optical Filter Using a Fabry-Perot Type Semiconductor Laser Amplifier", Electronic & Communications in Japan, Part II, May 1990 New York.

* cited by examiner

OPTICAL SPECTRAL FILTERING AND DISPERSION COMPENSATION USING SEMICONDUCTOR OPTICAL AMPLIFIERS

BACKGROUND

1. Field of the Invention

The embodiments of the invention generally relate to high speed data communications protocols, and, more particularly, to Fiber Channel Protocol (FCP) and Fiber Connectivity (FICON) links and including, but not limited to, such protocols such as Ethernet for networking, storage and related applications.

2. Description of the Related Art

Across the data communication industry, Fibre Channel Protocol (FCP) and Fiber Connectivity (FICON) protocols are used for networking, storage, and related applications. It will be understood to those of skill in the art that the term FCP in the present disclosure is interchangeable with the term FICON because the disclosure of the invention set forth herein relates to the physical layer properties of these protocols. Fiber optic links have been defined for FCP protocol operating at several data rates as defined by ANSI. Currently, 1 Gbit/s and 2 Gbit/s links are most commonly used, although higher data rates such as 4 Gbits/s and above are beginning to emerge. Since FCP has become established as a critical enabler for computer networks, adopting higher bandwidth FCP links would be beneficial. FCP is defined as supporting 4 Gbit/s data rates over up to 10 km over single-mode fiber. The implementation of 4 Gbit/s and higher data rates over single-mode fiber with long wavelength (LX) sources (e.g., 1300 nm center wavelength) in a cost effective and efficient manner remains a challenge.

One way to support 4 Gbits/sec data rate is by using a distributed feedback (DFB) laser. A DFB laser can support a 4 Gbits/s data rate at 10 km over single-mode fiber, but tends to be expensive relative to Fabry-Perot lasers. The Fabry-Perot (FP) lasers are used reliably in lower data rate and shorter (e.g., 3-5 km) FCP links. To enable FP lasers to function at the 4 Gbit/s rate over 10 km additional complexity is required in the design to comply the FCP standard.

Short wavelength (SX) optical pulses, as well as LX pulses, present excessive dispersion as optical pulses propagate down the fuser with the implementation of 4 Gbit/s and higher data rates over multi-mode fiber with short wavelength (SX) light sources (e.g., 850 nm). Dispersion is a function of laser center wavelength and spectral width. SX links are typically specified in the range of 100-300 meters, compared with 10 km for an LX link. Even in fairly short optical links, dispersion is a limiting factor for BER performance.

Optical communication links require amplification (e.g., semiconductor optical amplifiers, semiconductor laser amplifiers, doped fiber amplifiers, etc.) to extend their distances for applications such as disaster recovery in a storage area network. Semiconductor optical amplifiers (SOAs) have proved useful in this regard. An SOA functions much like an in-line semiconductor laser diode that is optically pumped. In conventional applications which require extremely long distances, the most desirable conventional feature of the SOA is high gain. Conventional SOAs are designed with a broad spectral width to accommodate a wider range of input devices (and possible wavelength multiplexing in some cases). It amplifies incoming optical signals without requiring optical/electrical conversions.

The SOA is itself very similar in construction to a Fabry Perot semiconductor laser diode, using a mirrored optical cavity to affect gain in the direction of propagation for an optical signal. The mirrors are used to increase the effective path length through the gain medium, and hence increase the overall gain. The SOA may offer potential advantages over other optical amplification technologies such as doped fiber amplifiers. However, the invention disclosed herein may be practiced with any semiconductor optical amplifiers, i.e. amplifiers which can be biased with respect to their threshold setting and easily integrated with a laser package, as one known to those of skill in the art. The SOA can be monolithically integrated with other semiconductor devices on a common chip or substrate and mass produced at low cost. SOAs can easily amplify light at various wavelengths including 1300 nm and 850 nm. The SOA is a low cost solution to amplify the 1300 nm and 850 nm wavelength windows most commonly used in data communication systems such as FCP (other industry standards, including Ethernet, also use the same wavelength windows). SOAs are often used in gain clamping configurations. To optimize the achievable distance, SOAs may also be positioned near the middle of a long distance optical link.

U.S. Pat. No. 6,674,784, herein incorporated by reference, discloses a distributed feed back laser device. U.S. Pat. No. 6,584,126, herein incorporated by reference, discloses a tunable Fabry-Perot laser device and a vertical cavity surface emitting laser (VCSEL) device. U.S. Pat. No. 6,894,833, herein incorporated by reference, discloses a semiconductor optical amplifier used to amplify laser output. U.S. Pat. No. 6,839,481, herein incorporated by reference, discloses a multimode optical fiber system.

SUMMARY

In view of the foregoing, an embodiment of the invention provides a device and a method for extending the bandwidth of SX and LX fiber optic lengths. The invention provides for an optical transmitter package device comprising: a laser diode; and a semiconductor optical amplifier which is positioned directly after the laser diode, either directly connect to or in very close proximity to the laser, This configuration as described herein may be referred as a pre-amplifier configuration with the laser diode, wherein the semiconductor optical amplifier is adapted to operate in a frequency domain such that the semiconductor optical amplifier filters and reshapes optical wavelengths from the laser diode, and wherein the semiconductor optical amplifier is biased below an amplification threshold for the semiconductor optical amplifier. The device may also comprises a feedback circuit which comprises an optical splitter, wherein the feedback circuit samples reshaped optical output from the semiconductor optical amplifier and dynamically adjusts one or both of the semiconductor optical amplifier and the laser diode.

In other embodiment the semiconductor optical amplifier and the laser diode of the invention are offset from each other a controlled amount from a center point of the laser diode such that a predetermined amount of optical output of the laser diode is coupled into a multimode fiber.

Moreover, the semiconductor optical amplifier, of the invention are configured as frequency domain spectral filters to regulate the frequency content of a laser diode at either 1300 nm or 850 nm nominal center wavelength. It is understood by those of skill in the art that the term FCP will be used throughout this description, with the understanding that the description herein applies to the physical layer of FICON links, and more generally to any similar fiber optic data communication protocols.

Additional features and advantages are realized through the techniques of the present invention. Other embodiments and aspects of the invention are described in detail herein and are considered a part of the claimed invention. For a better understanding of the invention with advantages and features, refer to the description and to the drawings.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
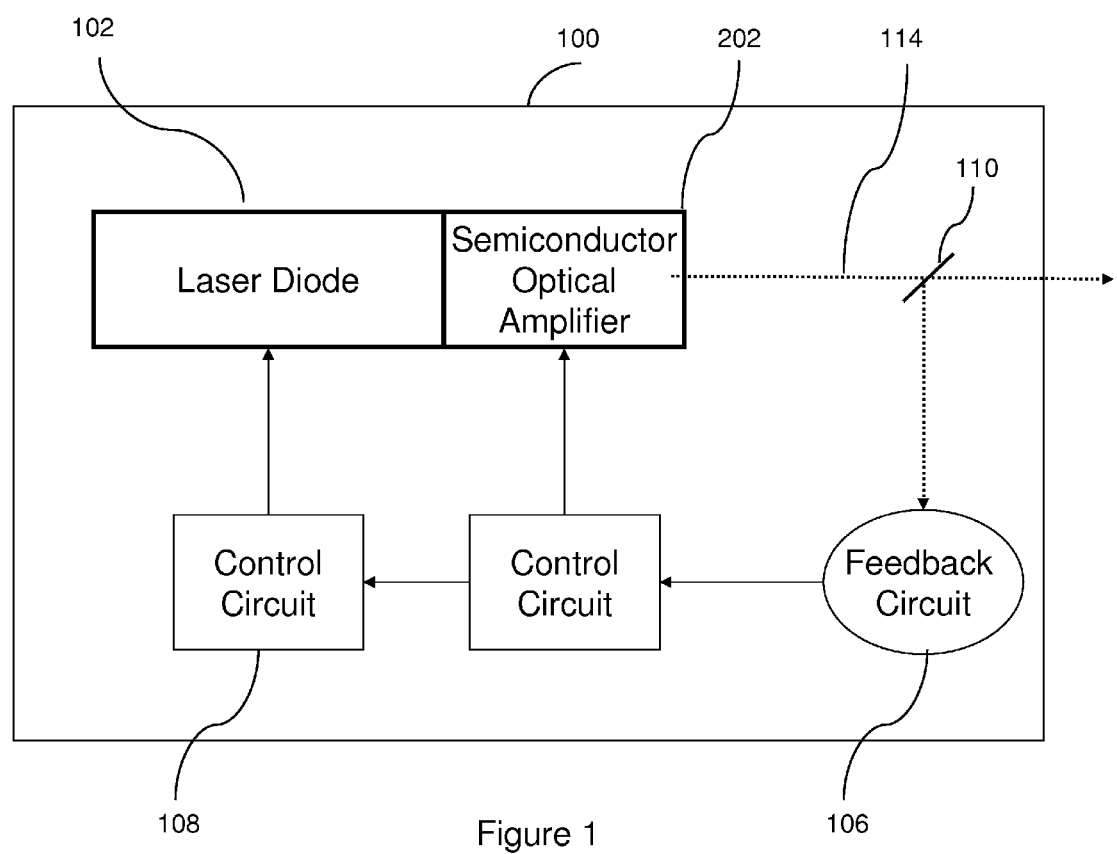
FIG. 1 illustrates a schematic diagram of an optical transmitter package device for extending fiber optic bandwidth.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Figure 2:
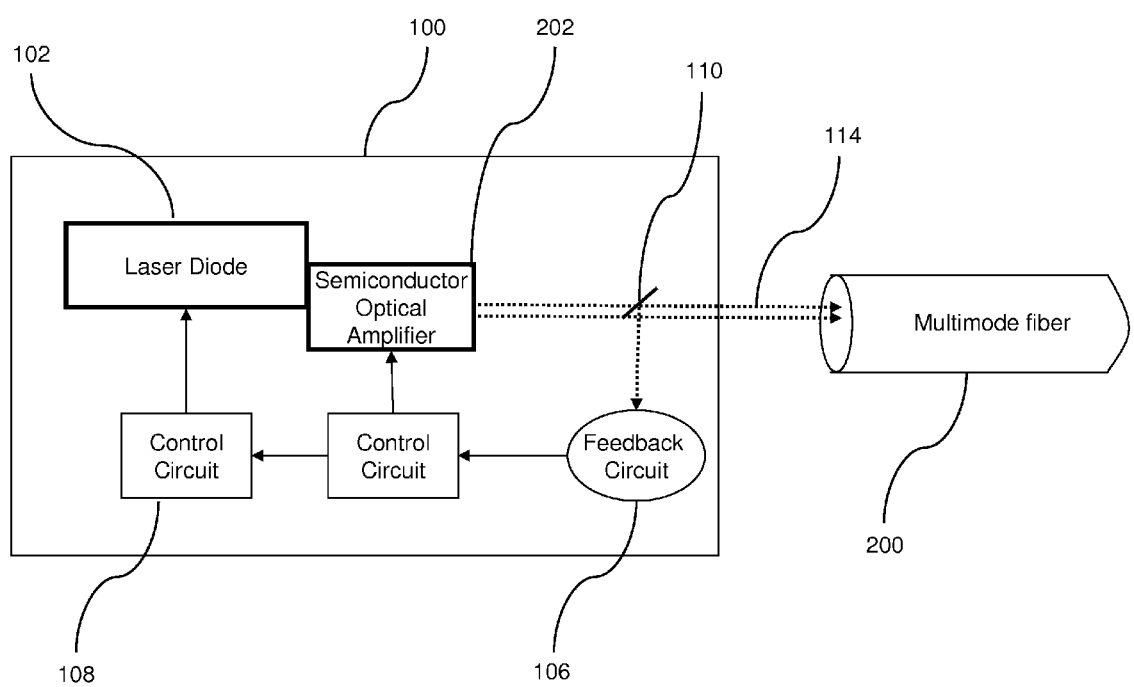
FIG. 2 illustrates a schematic diagram of an optical transmitter package device for extending fiber optic bandwidth in multimode fiber applications.
Figure 3:
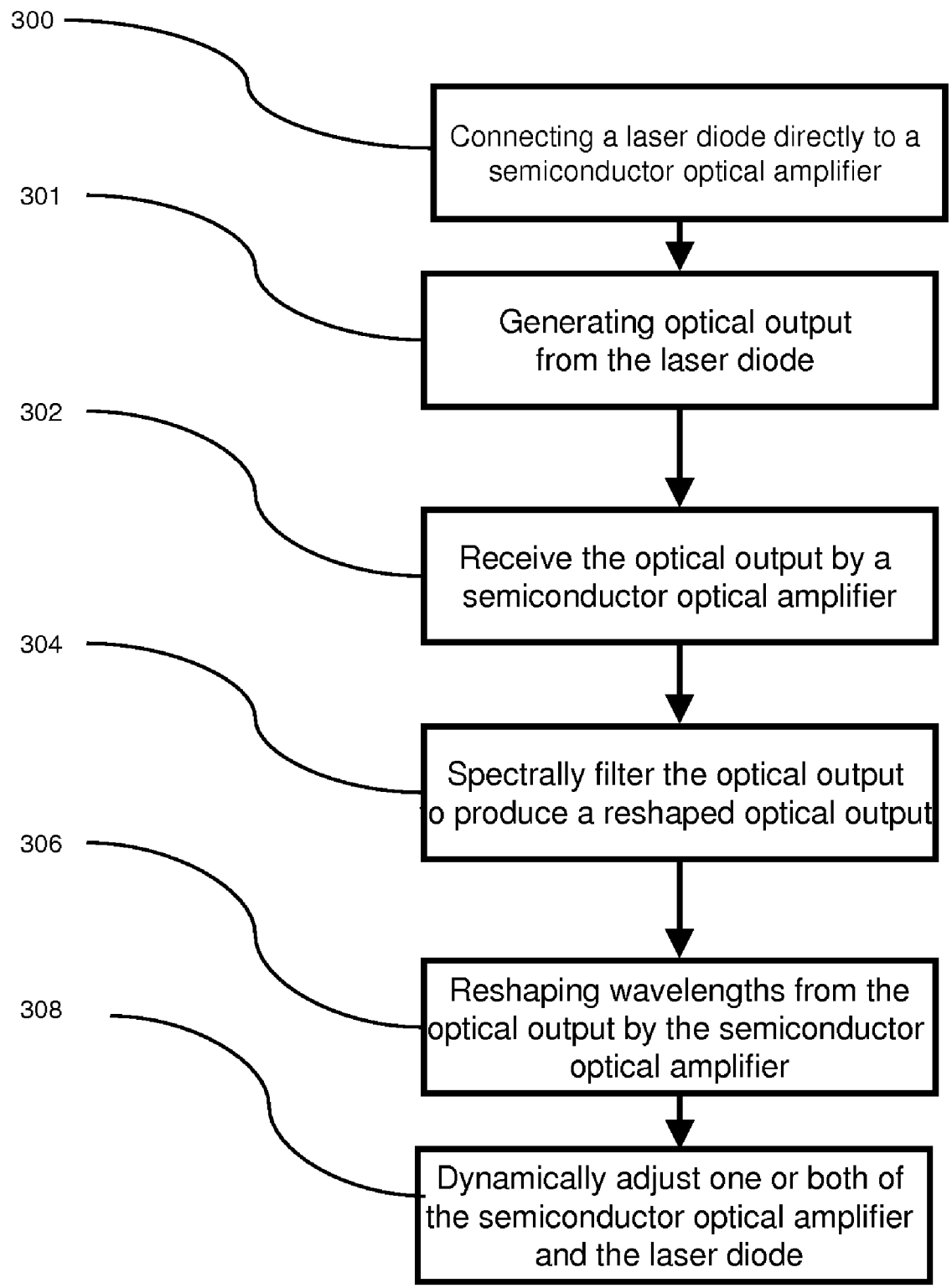
FIG. 3 is a flow diagram illustrating a preferred method of an embodiment of the invention.

As mentioned, there remains a need for increasing fiber optic bandwidth. The embodiments of the invention achieve this by providing a device and method which extends fiber optic length bandwidth using existing laser transmitters combined with semiconductor optical amplifiers in a common package. Referring now to the drawings, and more particularly to FIGS. 1 through 3, where similar reference characters denote corresponding features consistently throughout the figures, there are shown preferred embodiments of the invention.

The invention disclosed in FIG. 1 provides for an optical transmitter package device (100) comprising: a laser diode (102); and a semiconductor optical amplifier (104) the semiconductor optical amplifier positioned directly after the the laser diode,either directly connected to or in close proximity to the laser, in a pre-amplifier configuration with the laser diode, wherein the semiconductor optical amplifier is adapted to operate in a frequency domain such that the semiconductor optical amplifier filters and reshapes optical output (112) from the laser diode, and wherein the semiconductor optical amplifier is biased below an amplification threshold for the semiconductor optical amplifier. The pre-amplifier configuration comprises positioning the semiconductor optical amplifier adjacent to the laser diode such that optical output of the laser diode is highest for the laser diode. Any gain that may be provided by the seminconductor optical amplifier, is optional, negligible, or not provided. The semiconductor optical amplifier is biased below amplification threshold and provides for the reshaping of the spectral properties of the light output of the laser diode.

In another embodiment, the optical transmitter package device also comprises: a feedback circuit (106) which comprises an optical splitter (110), wherein the feedback circuit samples reshaped optical output (114) from the semiconductor optical amplifier and dynamically adjusts one or both of the semiconductor optical amplifier and the laser diode. The feedback circuit is connected to at least one control circuit (108) which dynamically adjusts the bias voltage and/or drive current of one or both of the semiconductor optical amplifier and the laser diode.

In the embodiment disclosed in FIG. 2, the device comprises a laser diode (102); and an offset semiconductor optical amplifier connected directly after the laser diode, either directly connected to or in close proximity to the laser, said laser diode (202) offset a controlled amount from a center point of the laser diode such that a predetermined amount of optical output of the laser diode is coupled into a multimode fiber (200), wherein the semiconductor optical amplifier is adapted to operate in a frequency domain such that the semiconductor optical amplifier filters and spectrally reshapes optical output from the laser diode. The reshaped optical output (114) from the semiconductor optical amplifier is preferentially launched into selected modes of the multimode fiber. In this embodiment, optical connectors to reduce modal noise are not required between the laser diode and the semiconductor optical amplifier. The offset allows for the reduction of modal noise. In yet another embodiment of the present invention, the offset is in the range of 50% to 90% of the optical fiber's core diameter.

In yet another embodiment of the device having an offset semiconductor optical amplifier further comprises a feedback circuit (106) which comprises an optical splitter (110), wherein the feedback circuit is adapted to sample reshaped optical output from the semiconductor optical amplifier and is connected to at least one control circuit (108) which dynamically adjusts the bias voltage and/or the drive current of one or both of the semiconductor optical amplifier and the laser diode.

FIG. 3, illustrates another embodiment of the invention. FIG. 3 depicts a flow diagram of a method for extending fiber optic bandwidth comprising connecting a laser diode directly to a semiconductor optical amplifier (300); generating optical output from a laser diode (301); receiving the optical output by a semiconductor optical amplifier located immediately after the laser diode in a pre-amplifier configuration with the laser diode (302); and spectrally filtering the optical output by launching the optical output into the semiconductor optical amplifier to produce a reshaped optical output (304), reshaping the wavelengths from the optical output from the semiconductor optical amplifier (306). The method further comprises dynamically adjusting one or both of the semiconductor optical amplifier and the laser diode by adjusting a bias voltage and/or a drive current of one or both of the semiconductor optical amplifier or the laser diode (308).

In another embodiment of the method, the method further comprises deliberately offsetting the laser diode and the semiconductor optical amplifier, wherein the deliberately offsetting facilitates mode conditioning in a multimode fiber. In yet another embodiment, the method further comprises coupling a predetermined amount of the optical output into a multimode fiber by offsetting the semiconductor optical amplifier a controlled amount from the laser diode center point and launching the reshaped optical into the multimode fiber.

More particularly, the device and method disclosed herein may extend existing Fabry-Perot LX lasers to 10 km over single-mode fiber by using a semiconductor optical amplifier (SOA) in a pre-amplifier configuration, (biased below threshold), to control the laser spectral width, as disclosed above. The SOA of the invention is biased below its amplification threshold level. The pre-amplifier configuration of the invention locates the SOA immediately after the laser transmitter where the laser output power is already at its highest. Rather than use the SOA in the time domain to achieve high gain, the SOA of the present method is operated in the frequency domain for wavelength filtering. As such, the SOA acts as a filter to discard spectral components which are not required; this effectively narrows the spectra of a Fabry-Perot laser, or other lasers as are known in the art (e.g., VCSEL lasers, DFB lasers, etc.).

The light emerging from an SOA has a different spectral width than the spectrum of the input light. Thus, an optical signal entering the SOA will experience changes in its spectral properties. Wavelength selective gain may also result in which the additional optical power is distributed across a different range of frequencies. If the SOA is operated at higher voltages or currents (still below threshold), the gain increases and the spectral broadening changes as well.

The remaining spectral components may still experience some gain, thus the total optical power output may be regulated. The gain from the SOA may overcome any optical coupling or insertion loss associated with the SOA coupling to attached laser and optical fiber. In this manner, the output of the combined laser/SOA cascade produces an optical signal whose spectrum and center wavelength comply with the FCP specifications.

The present invention includes the use of an SOA, biased below threshold in the device and method disclosed herein, placed immediately after a semiconductor laser source. The SOA is not being used for its amplification properties in this case. Rather, it is used only as a frequency-selective component to spectrally filter the laser output. The SOA functions in this manner because the SOA operates at the same wavelength as the desired laser source, typically 1300 nm or 850 nm. The SOA does not gain clamp, and in fact any amount of gain produced by the SOA is not critical or substantial as it would be in conventional SOA applications. The SOA only needs to selectively amplify those components of the laser spectra which are desired to adjust the overall frequency envelope and minimize dispersion as described herein. The SOA may offer potential advantages over other optical amplification technologies such as doped fiber amplifiers. However, the invention disclosed herein may be practiced with any optical amplifier as one known to those of skill in the art, provided that the amplifier operates within a suitable wavelength range of the semiconductor laser.

Some elements of the present disclosure include the use of a semiconductor optical amplifier (SOA) integrated with a short wavelength (SX) VCSEL (it is understood throughout the specification that any discussion of VCSEL lasers apply to any SX lasers as are known in the art) or long wavelength (LX) laser diode. The SOA is placed directly after the laser, either in the same package or a different package. The SOA to selectively reshapes the spectral frequency content of the laser such that the resulting signal will experience less dispersion when traveling through an optical fiber communication link. The SOA does not provide gain rather modifies the spectral properties of the laser in the frequency domain.

More particularly in yet another embodiment of the invention, the bias voltage or drive current of the SOA, laser, or both can be dynamically adjusted using a feedback loop based on an optical splitter which samples the output light. This embodiment of the invention uses a feedback control loop to monitor the SOA bias voltage, with a monitor and control circuit that allow the SOA to regulate the laser bias voltage as a means of controlling its spectral output (either its spectral width, center wavelength, or both). The invention may also sample output light after it passes through the SOA and may use the spectral content or signal strength to control one or both the SOA bias voltage and laser bias voltage. One or both of SOA drive current and laser drive current may also thus be adjusted.

More particularly as to embodiment comprising multimode applications involving an SX link and multimode fiber, the amount of light launched into the fiber should be maximized due to the high loss of multimode links as noted previously. However, it is possible to monitor the current from the SOA and correlate this with the spectral reshaping. This information may be used to digitally control the laser diode through a feedback circuit to the laser diode driver. In multimode applications, the alignment of the laser diode and amplifier is deliberately offset so as to control the modal launch profile and preferentially excite only certain modes of the optical fiber. This misalignment will lower the achievable peak optical power. However, optical power should still be maximized taking the offset into consideration.

Lasers can be dispersion compensated by using a semiconductor optical amplifier (SOA) in a pre-amplifier configuration to control the laser spectral width as described throughout the disclosure.

Even more particularly, the SOA in a pre-amplifier configuration is located immediately after the VCSEL laser transmitter where the laser output power is already at its highest as previously disclosed. The SOA filters out and discards spectral components which are not required. This effectively narrows and reshapes the spectra of a VCSEL laser. The remaining spectral components experience gain, thus the total optical power output is preserved. In fact, the SOA may provide optional gain which can overcome any optical coupling or insertion loss associated with the SOA. Multimode optical fibers at short wavelengths may have much higher loss (around 3-5 dB per km) as compared with single-mode fibers (0.5 dB/km). The present embodiment may compensate for multimode fiber dispersion and potentially increases coupled optical power into the fiber. In another embodiment, the bias voltage or drive current of the SOA, laser, or both can be dynamically adjusted, as discussed herein, using a feedback loop based on an optical splitter which samples the output light as described previously. The present invention provides for controlling the spectral content of light entering the optical fiber. Certain types of standard fiber experience wavelength dependent dispersion, which is specified by the manufacturer of such devices. By providing for the control of the spectral content of the light, the present invention allows for the compensation of known dispersion properties of an optical fiber.

Even more particularly as to multimode application, the SOA provides another important function in SX transceivers, namely a deliberate misalignment between the laser and SOA allows compensation for differential mode delay (DMD).

Generally, when optical power from an SX source is launched into a multimode fiber, all propagating modes within the fiber should be excited equally. Failure to do this, for example, by launching most of the optical power into modes near the fiber core, leads to differential mode delay (DMD) and modal noise.

Light is launched into the multimode fiber in a misaligned many, which may be accomplished conventionally by using a fiber connector/ferrule in which the fiber is displaced by a distance in the range of 50% to 90% of the optical fiber's core diameter.

However, this approach requires non-standard optical connectors with precise tolerances and is expensive. Moreover, different and more complex types of multimode connector assembly for SX laser links are required. The present embodiment, rather, involves a controlled offset in alignment between the SOA and the laser diode within an optical transceiver. Rather than a mechanical ferrule to offset the fiber with respect to the axis of the laser in the connector, the invention offsets the filtered light going into th optical fiber by using the optical amplifier filter. Thus, only the fraction of laser light which passes through the SOA will be spectrally reshaped and coupled into the fiber; thus, the SOA also acts as a spatial filter, and only light which passes through the SOA will propagate through the fiber. By offsetting the SOA a controlled amount from the laser center point, the SOA may preferentially couple into the fiber's higher order modes and achieve the desired uniform power profile without the need for a special optical connector.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

The invention claimed is:

1. An optical transmitter package device comprising:
    a laser diode;
    an offset semiconductor optical amplifier operatively connected to said laser diode;
    a multimode fiber connected to said semiconductor optical amplifier; and
    a feedback circuit comprising an optical splitter connected to said semiconductor optical amplifier,
    wherein said semiconductor optical amplifier is offset a controlled amount from a center point of said laser diode such that a predetermined amount of optical output of said laser diode is coupled into said multimode fiber,
    wherein said semiconductor optical amplifier is offset relative to the direction of propagation of said optical output,
    wherein said semiconductor optical amplifier is adapted to operate in a frequency domain such that said semiconductor optical amplifier filters and spectrally reshapes optical output from said laser diode, and
    wherein said feedback circuit is adapted to sample reshaped optical output from said semiconductor optical amplifier and dynamically adjust at least one of said semiconductor optical amplifier and said laser diode.

2. The device of claim 1, wherein said laser diode and said offset semiconductor optical amplifier are connected devoid of intervening optical connectors.

3. The device of claim 1, further comprising:
    a feedback circuit comprising an optical splitter connected to said semiconductor optical amplifier,
    wherein said feedback circuit is adapted to sample reshaped optical output from said semiconductor optical amplifier and dynamically adjust at least one of said semiconductor optical amplifier and said laser diode.

4. The device of claim 1, wherein said feedback circuit is connected to a control circuit, wherein said control circuit is adapted to adjust a bias voltage selected from at lease one of said semiconductor optical amplifier and said laser diode.

5. The device of claim 1, wherein said feedback circuit is connected to a control circuit, wherein said control circuit is adapted to dynamically adjust a drive current selected from at least one of said semiconductor optical amplifier and said laser diode.

* * * * *